United States Patent [19]

Yu

[11] Patent Number: 5,693,564
[45] Date of Patent: Dec. 2, 1997

[54] CONDUCTOR FILL REFLOW WITH INTERMETALLIC COMPOUND WETTING LAYER FOR SEMICONDUCTOR FABRICATION

[75] Inventor: Jick M. Yu, Beaverton, Oreg.

[73] Assignee: Intel Corporation, Santa Clara, Calif.

[21] Appl. No.: 363,647

[22] Filed: Dec. 22, 1994

[51] Int. Cl.$^6$ ................................................... H01L 21/44
[52] U.S. Cl. ........................ 437/192; 437/174; 437/194; 437/197; 148/DIG. 3
[58] Field of Search ................................. 437/194, 192, 437/197, 174; 148/DIG. 3

[56] References Cited

U.S. PATENT DOCUMENTS

| | | | |
|---|---|---|---|
| 4,141,020 | 2/1979 | Howard et al. | 357/16 |
| 5,423,939 | 6/1995 | Bryant et al. | 437/174 |
| 5,443,995 | 8/1995 | Nulman | 437/194 |
| 5,472,912 | 12/1995 | Miller | 437/194 |

OTHER PUBLICATIONS

"Multiple Metal Film Structures for Wiring VLSI Circuit Chips," *IBM Technical Disclosure Bulletin*, vol. 33, No. 1A, pp. 15–16 (Jun. 1990).
"Refractory Intermetallic Compounds for Local Interconnections," *IBM Technical Disclosure Bulletin*, vol. 33, No. 2, p. 416 (Jul. 1990).
"Elaboration of a Large Grain Layer to Protect Barrier Layers," *IBM Technical Disclosure Bulletin*, vol. 33, No. 10B, pp. 75–76(Mar. 1991).
"Process to make High–Aspect–Ratio Vias Using the Al(Ge) Reflow Process With Good Electromigration Resistance," *IBM Technical Disclosure Bulletin*, vol. 36, No. 1, p. 443 (Jan. 1993).

Wolf, S., et al., *Silicon Processing for the VLSI Era, Volume 1: Process Technology*, Lattice Press, Sunset Beach, California, pp. 332–334, 367–373 (1986).

Wolf, S., *Silicon Processing for the VLSI Era, Volume 2: Process Integration*, Lattice Press, Sunset Beach, California, pp. 121–131, 191, 240–242, 254–256, 264–267 (1990).

*Primary Examiner*—Robert Kunemund
*Attorney, Agent, or Firm*—Blakely, Sokoloff, Taylor & Zafman

[57] ABSTRACT

A conductor fill technique uses an intermetallic compound wetting layer to allow a subsequent conductive material to be reflowed with minimized interaction between the conductive layer and the wetting layer. As one example, a wetting layer including TiAl or TiAl$_3$ may be formed over a semiconductor wafer and in an opening of the wafer. A conductive layer including aluminum (Al) may then be deposited and reflowed over the wafer to fill the opening in forming a contact, via, or interconnect line, for example, with minimized interaction between the aluminum (Al) of the conductive layer and the wetting layer. Any reduction in conductance of the material filled in the opening may be minimized as the formation of any new intermetallic TiAl$_3$ compounds that would otherwise increase the resistance of the material filled in the opening is minimized. Relatively denser and/or smaller-sized semiconductor devices may be fabricated with conductors that benefit from the relatively lower resistance of aluminum (Al) as aluminum (Al) may be used to fill relatively smaller openings with minimized reduction in conductance.

20 Claims, 5 Drawing Sheets

CONDUCTOR FILL REFLOW WITH INTERMETALLIC COMPOUND WETTING LAYER FOR SEMICONDUCTOR FABRICATION

BACKGROUND OF THE INVENTION

1. Field of the Invention

The present invention relates generally to the field of semiconductor fabrication. More particularly, the present invention relates to the field of conductor fill processing techniques for semiconductor fabrication.

2. Description of the Related Art

In fabricating a semiconductor device, conductor fill processing techniques are typically used to form various conductive contacts, vias, and interconnect lines in the device.

For one technique, a titanium (Ti) wetting layer is sputter deposited over a semiconductor wafer to line an opening. Aluminum (Al) is then sputter deposited over the semiconductor wafer and reflowed to fill the opening. The titanium (Ti) wetting layer helps to reduce the interfacial energy between the aluminum (Al) and the semiconductor wafer and to minimize or avoid agglomeration between the aluminum (Al) and the semiconductor wafer. Agglomeration may lead to the formation of cracks and voids in the aluminum (Al) and thus reduce the conductance of the aluminum (Al) fill or create an open circuit in the semiconductor device being fabricated.

At the relatively higher temperature for reflow, however, the aluminum (Al) interacts with the titanium (Ti) wetting layer and forms a TiAl₃ intermetallic compound layer within the opening. Where the titanium (Ti) wetting layer is relatively thinner, the resulting TiAl₃ layer is not continuous but rather contains voids where agglomeration may occur. A relatively thicker titanium (Ti) wetting layer may be used to avoid agglomeration. The thickness of the resulting TiAl₃ layer, however, is relatively greater as compared to the initial thickness of the titanium (Ti) wetting layer. The conductance of the material filled in the opening, then, is relatively reduced as TiAl₃ has a relatively higher resistance as compared to aluminum (Al).

This conductor fill technique, then, may limit how small openings may be made and subsequently filled with aluminum (Al) as a relatively thicker titanium (Ti) wetting layer may lead to a resulting TiAl₃ layer that substantially consumes relatively smaller openings whereas a relatively thinner titanium (Ti) wetting layer may lead to agglomeration. Although trenches, channels, and other openings may be made relatively larger to benefit from the relatively lower resistance of aluminum (Al), this consideration weighs against the desirability of fabricating relatively denser and/or smaller-sized semiconductor devices.

For another conductor fill technique, a first aluminum (Al) layer is sputter deposited over a titanium (Ti) wetting layer that lines an opening. This first aluminum (Al) layer does not completely fill the opening and is sputtered at a relatively lower temperature to help avoid the formation of TiAl₃ as a result of any interaction between the first aluminum (Al) layer and the titanium (Ti) wetting layer. A second aluminum (Al) layer is subsequently sputter deposited over the first aluminum (Al) layer and reflowed to fill the opening. The first aluminum (Al) layer in conjunction with the titanium (Ti) wetting layer provides for a relatively thicker layer over which aluminum (Al) is sputtered and reflowed, helping to avoid agglomeration.

The first aluminum (Al) layer, however, may not be deposited with adequate step coverage in the opening at the relatively lower temperature, particularly for openings having relatively smaller widths and/or relatively higher aspect ratios. Agglomeration may therefore occur at reflow as the first aluminum (Al) layer may not be deposited with a sufficient thickness over all areas of the titanium (Ti) wetting layer in the opening. Furthermore, a TiAl₃ intermetallic compound layer is formed in the opening as the relatively higher temperature at reflow causes the aluminum (Al) in the opening to interact with the titanium (Ti) wetting layer. conductance of the material filled in the opening is therefore relatively reduced as the TiAl₃ layer is relatively thicker as compared to the initial thickness of the titanium (Ti) wetting layer.

BRIEF SUMMARY AND OBJECTS OF THE INVENTION

One object of the present invention is to provide for a conductor fill technique for openings having relatively smaller widths and/or relatively higher aspect ratios.

Another object of the present invention is to provide for a conductor fill technique using a wetting layer that remains relatively stable during reflow of a conductor fill.

Another object of the present invention is to provide for a conductor fill technique in fabricating semiconductor devices with conductors that benefit from the relatively lower resistance of aluminum (Al).

A method for use in semiconductor fabrication using a semiconductor wafer is described. An opening is formed in a layer of the semiconductor wafer. A wetting layer having an intermetallic compound material is formed over the semiconductor wafer and in the opening. A conductive layer is formed over the wetting layer and in the opening.

Another method for use in semiconductor fabrication using a semiconductor wafer is also described. An opening is formed in a layer of the semiconductor wafer. A wetting layer having a compound material including at least two elements is formed over the semiconductor wafer and in the opening. A conductive layer having one of the at least two elements of the wetting layer is formed over the wetting layer and in the opening.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

The following detailed description sets forth an embodiment or embodiments in accordance with the present invention for conductor fill reflow with intermetallic compound wetting layer for semiconductor fabrication. In the following description, details are set forth such as specific materials, parameters, etc., in order to provide a thorough understanding of the present invention. It will be evident, however, that the present invention may be practiced without these details. In other instances, well-known process steps, equipment, etc., have not been described in particular detail so as not to obscure the present invention.

In fabricating a semiconductor device, conductor fill processing techniques are used to form, for example, various conductive contacts, vias, and/or interconnect lines in the device. Of a variety of metals and other conductive materials that may be used, aluminum (Al) is an advantageous conductor because of its relative reliability and relatively lower resistance.

Aluminum (Al) may be sputter deposited over a semiconductor wafer to fill trenches, channels, or other openings in the wafer to form contacts, vias, and/or interconnect lines, for example. To help improve the step coverage of sputtered aluminum (Al) in such openings, and in particular openings having relatively smaller widths and/or relatively higher aspect ratios, the aluminum (Al) may be heated or reflowed at relatively higher temperatures to help increase the surface migration of atoms in the aluminum (Al). This reflow process may also help to planarize the aluminum (Al).

Heating the aluminum (Al), however, may cause agglomeration as a result of any relatively higher interfacial energy between the aluminum (Al) and the wafer. Such agglomeration may lead to the formation of cracks and voids in the aluminum (Al) and thus reduce the conductance of the aluminum (Al) fill or create an open circuit in the semiconductor device being fabricated. To help reduce the interfacial energy between the aluminum (Al) and the wafer and thus help avoid agglomeration, a titanium (Ti) wetting layer may be deposited over the wafer prior to the sputter deposition of aluminum (Al).

Figure 1:
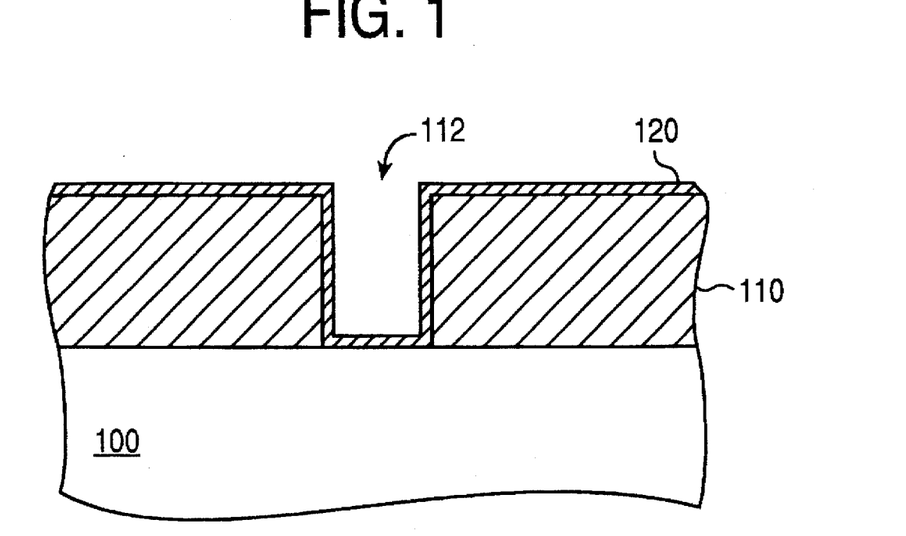
FIG. 1 illustrates a cross-sectional view of a semiconductor wafer after a titanium (Ti) wetting layer has been deposited over the wafer.
Figure 2:
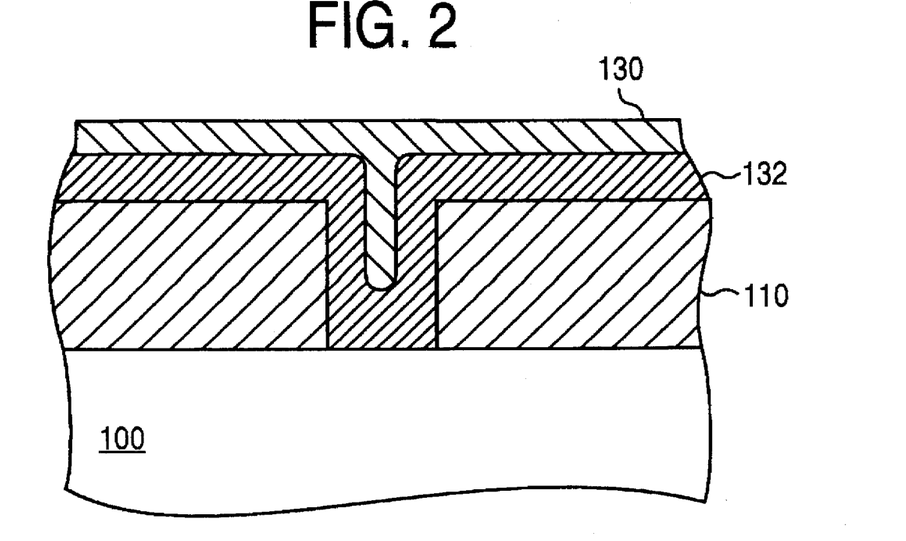
FIG. 2 illustrates a cross-sectional view of the semiconductor wafer of FIG. 1 after a sputter deposited aluminum (Al) layer has been reflowed.

One conductor fill technique using aluminum (Al) with a titanium (Ti) wetting layer is illustrated in FIGS. 1 and 2. FIG. 1 illustrates a cross-sectional view of a semiconductor wafer having a dielectric layer 110 formed over a semiconductor substrate 100. A contact opening 112 has been formed in dielectric layer 110 and exposes the surface of substrate 100 through dielectric layer 110. Contact opening 112 is to be filled with aluminum (Al) to form a contact plug, providing for electrical connection to an underlying region in substrate 100.

As illustrated in FIG. 1, a titanium (Ti) wetting layer 120 has been deposited over the wafer and lines the bottom and sidewalls of opening 112. An aluminum (Al) layer 130 is subsequently sputter deposited over wetting layer 120 and into opening 112. Aluminum (Al) layer 130 is reflowed to help improve the step coverage of aluminum (Al) in filling opening 112. Wetting layer 120 helps to reduce the interfacial energy between aluminum (Al) layer 130 and substrate 100 and/or dielectric layer 110. Wetting layer 120 also helps to minimize or avoid agglomeration between aluminum (Al) layer 130 and the material of substrate 100 and/or the material of dielectric layer 110.

At the relatively higher temperature for reflow, however, aluminum (Al) layer 130 interacts with the titanium (Ti) of wetting layer 120 and forms a $TiAl_3$ intermetallic compound layer 132 within opening 112, as illustrated in FIG. 2. Where titanium (Ti) wetting layer 120 is relatively thinner, the resulting $TiAl_3$ layer 132 may not be continuous but rather contain voids where agglomeration may occur. This agglomeration may cause the formation of cracks or voids in aluminum (Al) layer 130, reducing the conductance of aluminum (Al) layer 130 or creating an open circuit in the semiconductor device being fabricated.

A relatively thicker titanium (Ti) wetting layer 120 may be used to avoid agglomeration. The thickness of resulting $TiAl_3$ layer 132, however, is relatively greater as compared to the initial thickness of titanium (Ti) wetting layer 120. As one example, a titanium (Ti) wetting layer 120 having an approximately 300 Angstrom (Å) thickness may interact with aluminum (Al) layer 130 to create a $TiAl_3$ layer 132 having an approximately 1200Å thickness on the bottom and on each sidewall of opening 112. The conductance of the material filled in opening 112, then, is relatively reduced as $TiAl_3$ has a relatively higher resistance as compared to aluminum (Al). For an opening having a width of approximately 2500Å, $TiAl_3$ layer 132 substantially consumes opening 112 for this example.

The conductor fill technique illustrated in FIGS. 1 and 2, then, may limit how small openings may be made and subsequently filled with aluminum (Al) as a relatively thicker titanium (Ti) wetting layer 120 may lead to a resulting $TiAl_3$ layer 132 that substantially consumes relatively smaller openings whereas a relatively thinner titanium (Ti) wetting layer 120 may lead to agglomeration. Although trenches, channels, and other openings may be made relatively larger to benefit from the relatively lower resistance of aluminum (Al), this consideration weighs against the desirability of fabricating relatively denser and/or smaller-sized semiconductor devices.

Figure 3:
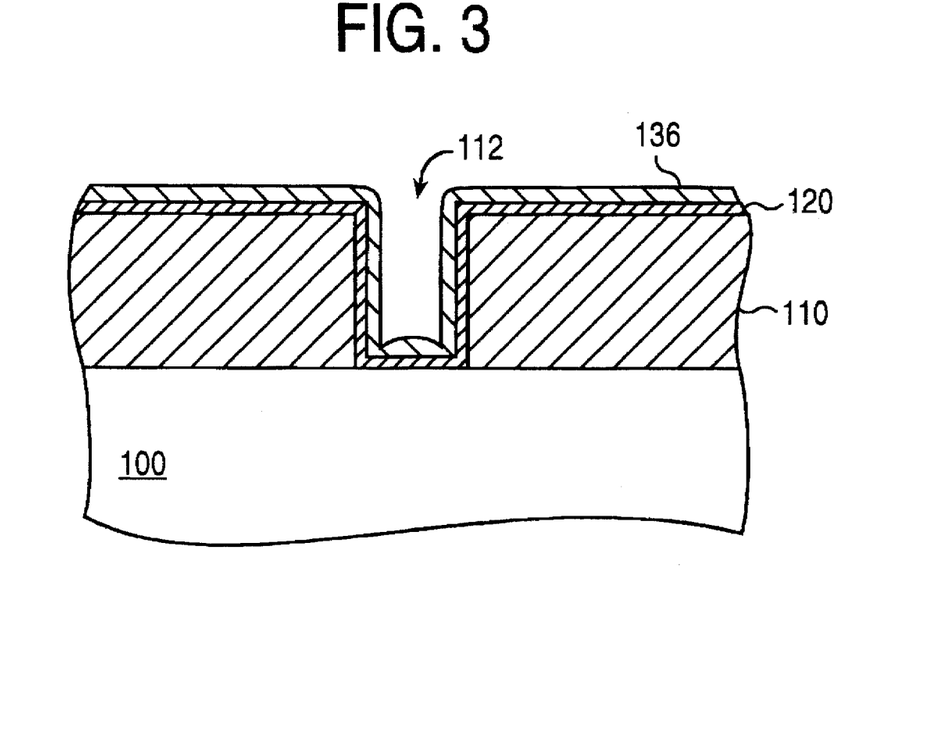
FIG. 3 illustrates a cross-sectional view of the semiconductor wafer of FIG. 1 after an aluminum (Al) layer has been deposited over the wetting layer at a relatively lower temperature.
Figure 4:
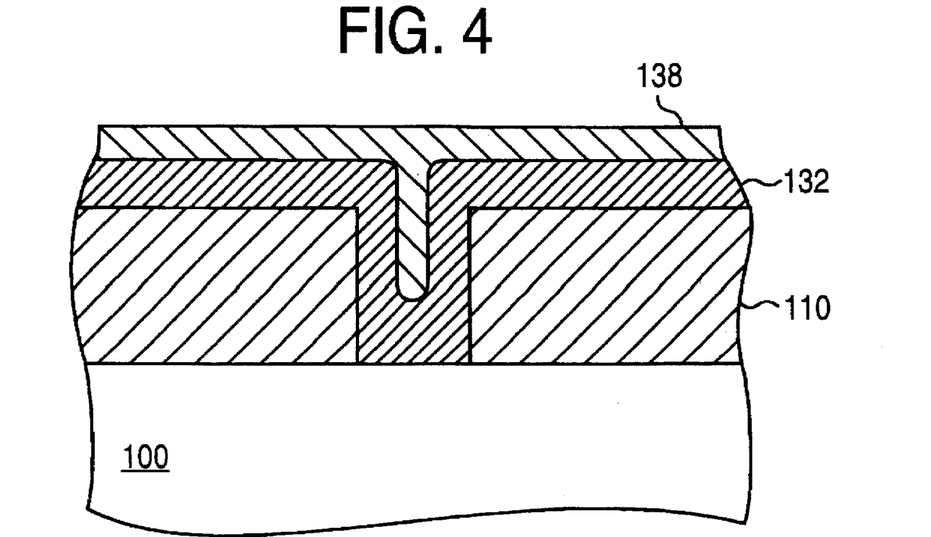
FIG. 4 illustrates a cross-sectional view of the semiconductor wafer of FIG. 3 after a sputter deposited aluminum (Al) layer has been reflowed.

Another conductor fill technique is illustrated in FIGS. 3 and 4. FIG. 3 illustrates a cross-sectional view of the semiconductor wafer of FIG. 1. A first aluminum (Al) layer 136 is sputter deposited over wetting layer 120 and into opening 112, as illustrated in FIG. 3. First aluminum (Al) layer 136 does not completely fill opening 112 and is sputtered at a relatively lower temperature to help avoid the formation of $TiAl_3$ as a result of any interaction between first aluminum (Al) layer 136 and the titanium (Ti) of wetting layer 120.

A second aluminum (Al) layer 138 is subsequently sputter deposited over first aluminum (Al) layer 136 and into opening 112. The aluminum (Al) is reflowed to help improve the step coverage of aluminum (Al) in filling opening 112. As compared to the conductor fill technique discussed above with reference to FIGS. 1 and 2, first aluminum (Al) layer 136 in conjunction with wetting layer 120 may provide for a relatively thicker layer over which aluminum (Al) is sputtered and reflowed, helping to delay the occurrence of agglomeration during reflow.

First aluminum (Al) layer 136, however, may not be deposited with adequate step coverage in opening 112 at the relatively lower temperature, particularly for openings having relatively smaller widths and/or relatively higher aspect ratios. Agglomeration may therefore occur at the relatively higher temperature during reflow as first aluminum (Al) layer 136 may not be deposited with a sufficient thickness over all areas of wetting layer 120 in opening 112. A collimation deposition technique may be used to deposit first aluminum (Al) layer 136 with adequate step coverage over wetting layer 120 while maintaining minimized interaction between first aluminum (Al) layer 136 and the titanium (Ti) of wetting layer 120. Collimation techniques, however, may prove relatively more costly and relatively more time consuming.

Furthermore, a $TiAl_3$ intermetallic compound layer 132 is formed in opening 112 as the relatively higher temperature for reflow causes the aluminum (Al) in opening 112 to interact with the titanium (Ti) of wetting layer 120, as illustrated in FIG. 4. Accordingly, the conductance of the material in opening 112 is relatively reduced, similar to the aluminum (Al) contact plug formed with the conductor fill technique discussed above with reference to FIGS. 1 and 2.

Figure 5:
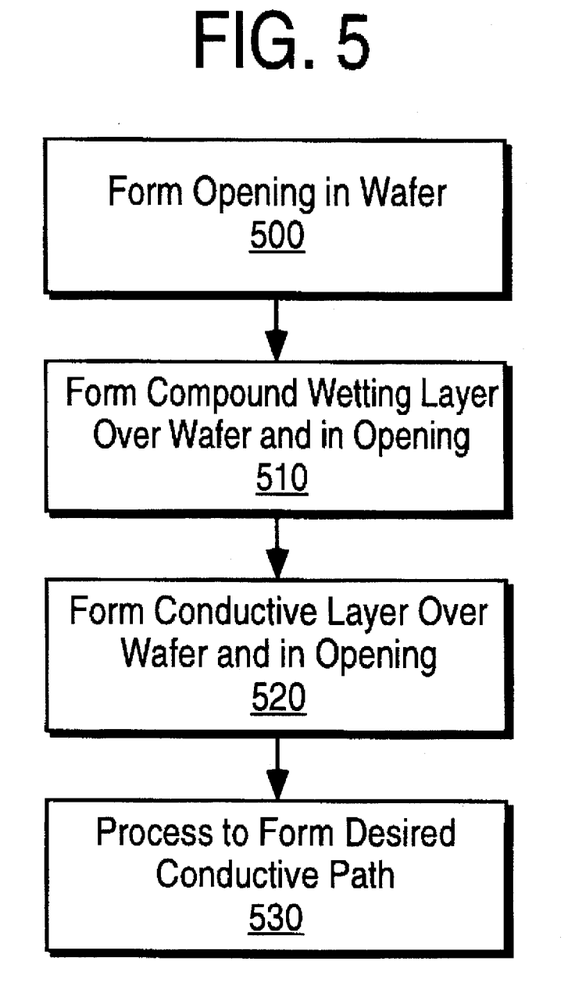
FIG. 5 illustrates, in flow diagram form, one conductor fill method for semiconductor fabrication.

FIG. 5 illustrates, in flow diagram form, one conductor fill method for semiconductor fabrication. For one embodiment, the method of FIG. 5 may be used for semiconductor fabrication using a semiconductor wafer, such as the semiconductor wafer illustrated in FIGS. 6, 7, and 8 for example. The conductor fill method of FIG. 5 may be used, for example, in fabricating various semiconductor devices, including digital integrated circuit components such as microprocessors, memories, controllers, etc.

Figure 6:
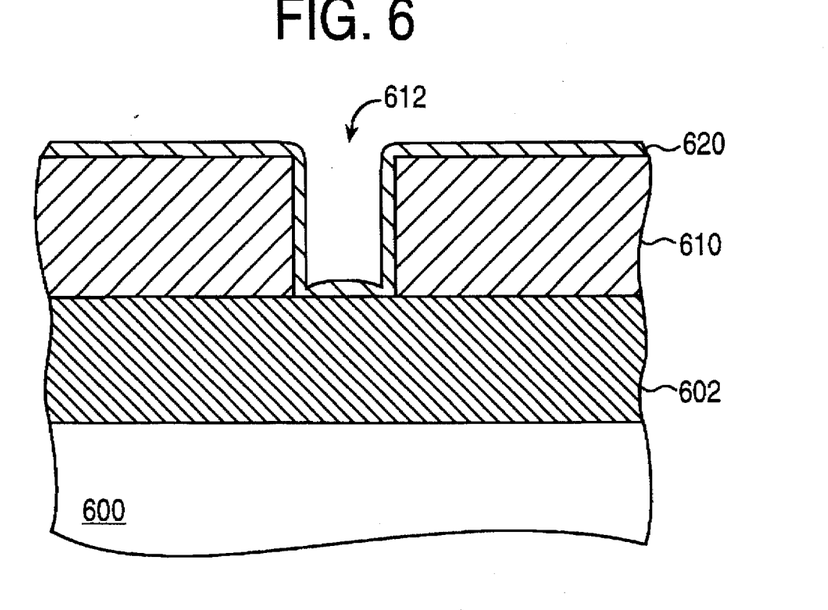
FIG. 6 illustrates a cross-sectional view of a semiconductor wafer after an opening has been formed in the semiconductor wafer and after a wetting layer has been formed over the wafer and in the opening in accordance with the method of FIG. 5.

For the method of FIG. 5, a semiconductor substrate 600 is provided as illustrated in FIG. 6. Substrate 600 may include any suitable material, including silicon (Si) for example.

As illustrated in FIG. 6, a layer 602 may be formed over substrate 600. Layer 602 may include any suitable material and may be formed to any suitable thickness using any suitable technique depending, for example, on the purpose of layer 602 in fabricating a desired semiconductor device. Layer 602 may include one or more layers, including device, dielectric, metallization, contact, interconnect, and/or via layers for example. As one example, layer 602 may include a layer over which a via or interconnect layer is to be formed. Layer 602 may have exposed regions to be electrically coupled by vias or interconnect lines formed in a subsequent layer. Layer 602 is not necessary to practice the method of FIG. 5.

A layer 610 is also formed over the semiconductor wafer of FIG. 6. Layer 610 may include any suitable material and may be formed over layer 602 to any suitable thickness using any suitable technique. Layer 610 may alternatively be formed directly over substrate 600. Layer 610 may include a dielectric material, such as silicon dioxide ($SiO_2$) for example, for use in forming a suitable contact, via, or interconnect layer, for example. Layer 610 may include a single layer or a plurality of layers.

For step 500 of FIG. 5, an opening is formed in the semiconductor wafer. As illustrated in FIG. 6, an opening 612 has been formed in layer 610. Opening 612 may be formed in layer 610 using any suitable technique. As one example, layer 610 may be patterned to form opening 612. Opening 612 may be etched from layer 610 through a suitable mask using any suitable etch technique and chemistry, for example. Opening 612 may be formed to expose an underlying layer, such as layer 602 for example. Opening 612 may be formed to expose a region to be electrically connected, for example.

Opening 612 may have any suitable dimensions and any suitable aspect ratio. Opening 612 may have a width of approximately 0.25 µm, for example, and a height of approximately 1.0 µm, for example. Opening 612 may have any suitable shape that may depend, for example, on the pattern of conductive material to be formed using opening 612. Opening 612 may be a contact opening, a via opening, or an interconnect channel, for example. The sidewalls of opening 612 may have any suitable profile. Opening 612 may have substantially vertical sidewalls or sloped sidewalls, for example.

For step 510 of FIG. 5, a compound wetting layer is formed over the semiconductor wafer and in the opening. As illustrated in FIG. 6, a compound wetting layer 620 is formed over the semiconductor wafer and in opening 612. Wetting layer 620 is formed to line the sidewalls and bottom of opening 612. Wetting layer 620 may include any suitable compound that may depend, for example, on the conductive material subsequently formed to fill opening 612. Wetting layer 620 may include an intermetallic compound, for example. Wetting layer 620 may include a compound material having two elements, for example. Wetting layer 620 may also include a compound material having more than two elements, such as three or four elements for example. Wetting layer 620 may be formed to any suitable thickness using any suitable technique.

Wetting layer 620 may be formed with a suitable material such that wetting layer 620 helps reduce the interfacial energy between the semiconductor wafer and a subsequently formed conductive layer. Wetting layer 620 may be formed to help avoid or minimize agglomeration between the semiconductor wafer and a subsequently formed conductive layer. Furthermore, wetting layer 620 may be formed with a suitable material such that wetting layer 620 has a relatively higher melting point and remains relatively stable at relatively higher temperatures for the reflow of a subsequently formed conductive layer, for example. Wetting layer 620 may also be formed as a relatively continuous layer that remains relatively continuous at relatively higher temperatures for the reflow of a subsequently formed conductive layer, for example.

For one embodiment, wetting layer 620 may include TiAl or $TiAl_3$ and may be formed over the semiconductor wafer to any suitable thickness using any suitable technique. Wetting layer 620 may be formed, for example, by sputter depositing TiAl or $TiAl_3$ directly over the semiconductor wafer. Wetting layer 620 may also be formed by sputter depositing titanium (Ti) and aluminum (Al) separately over the semiconductor wafer and heating the wafer at a temperature in the range of approximately 400 degrees Celsius to approximately 550 degrees Celsius to form the intermetallic compound TiAl or $TiAl_3$. The wafer may be heated for any suitable length of time, such as for approximately one minute for example. As a further example, wetting layer 620 may be formed by sputter depositing titanium (Ti) and aluminum (Al) simultaneously and heating the wafer at a temperature in the range of approximately 400 degrees Celsius to approximately 550 degrees Celsius to form the intermetallic compound TiAl or $TiAl_3$. The wafer may be heated for any suitable length of time, such as for approximately one minute for example.

Figure 7:
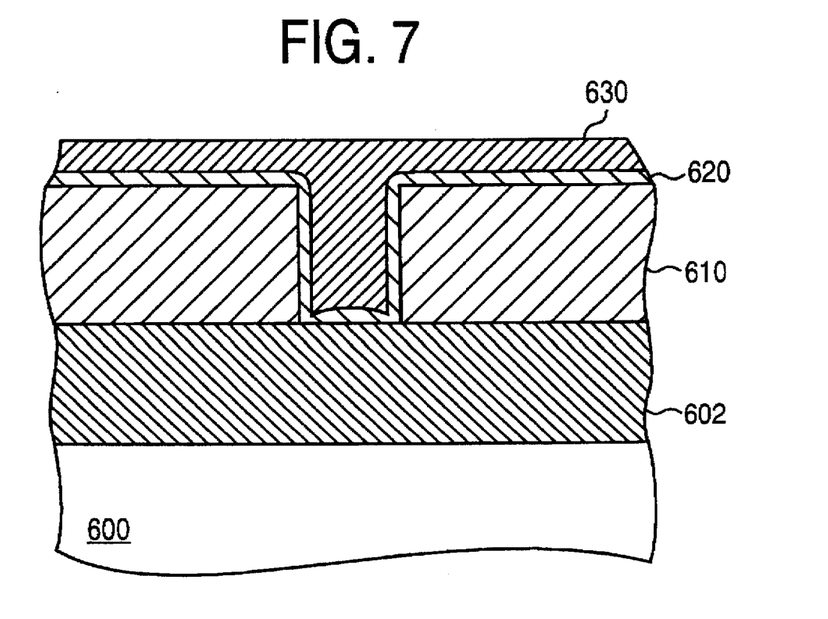
FIG. 7 illustrates a cross-sectional view of the semiconductor wafer of FIG. 6 after a conductive layer has been formed over the wafer and in the opening in accordance with the method of FIG. 5.

For step 520 of FIG. 5, a conductive layer is formed over the semiconductor wafer and in the opening. As illustrated in FIG. 7, a conductive layer 630 is formed over wetting layer 620 and in opening 612. Conductive layer 630 may include any suitable material that may depend, for example, on the compound used for wetting layer 620. Conductive layer 630 may include, for example, an element common to wetting layer 620. Conductive layer 630 and wetting layer 620 may each include the same metallic element, for example. Conductive layer 630 may be formed to any suitable thickness using any suitable technique. Conductive layer 630 may be formed to a suitable thickness so as to fill or substantially fill opening 612.

For one embodiment, conductive layer 630 includes aluminum (Al) and may be formed over the semiconductor wafer to any suitable thickness using any suitable technique. Conductive layer 630 may be deposited over the semiconductor wafer by sputter deposition, for example, to a thickness so as to fill or substantially fill opening 612. The aluminum (Al) of conductive layer 630 may be reflowed by heating the semiconductor wafer as the aluminum (Al) is sputter deposited over the wafer. The semiconductor wafer may be heated to a temperature of approximately 450 degrees Celsius, for example. Other suitable temperatures, for example in the range of approximately 400 degrees Celsius to approximately 500 degrees Celsius may also be used for the reflow of aluminum (Al) for conductive layer 630. The wafer may be heated for any suitable length of time, such as in the range of approximately one minute to approximately 3 minutes for example. For other embodiments, the aluminum (Al) of conductive layer 630 may be reflowed by heating the semiconductor wafer after deposition of the aluminum (Al).

The reflow of aluminum (Al) for conductive layer 630 helps to improve the step coverage of aluminum (Al) over the semiconductor wafer. As opening 612 may be formed with a relatively smaller width and/or a relatively higher aspect ratio, the reflow of aluminum (Al) for conductive layer 630 helps ensure opening 612 is filled or substantially filled with aluminum (Al) with minimized void formation. The reflow of aluminum (Al) for conductive layer 630 also helps to planarize the top surface of conductive layer 630.

Where wetting layer 620 includes TiAl or TiAl$_3$, for example, agglomeration is minimized or avoided as the aluminum (Al) is reflowed in forming conductive layer 630. As compared to the use of titanium (Ti) over which aluminum (Al) is reflowed as discussed above, intermetallic compounds TiAl and TiAl$_3$ have relatively higher melting points and remain relatively stable at the relatively higher temperatures used for reflowing aluminum (Al). The use of TiAl or TiAl$_3$ also provides for a relatively continuous wetting layer that remains relatively continuous during the reflow process. With minimized or no agglomeration, conductive layer 630 may be formed with minimized, if any, cracks or voids that would otherwise serve to reduce the conductance of conductive layer 630 or create an open circuit in the semiconductor device being fabricated.

Furthermore, wetting layer 620 may be formed such that any growth in thickness of TiAl or TiAl$_3$ as a result of any interaction between the aluminum (Al) of conductive layer 630 and wetting layer 620 is minimized as the intermetallic compound TiAl or TiAl$_3$ of wetting layer 620 remains relatively stable at the relatively higher temperature at reflow. With a given initial thickness, wetting layer 620 consumes relatively less of an opening after reflow as compared to a TiAl$_3$ layer formed by the reflow of aluminum (Al) over a titanium (Ti) wetting layer having that same initial thickness. Any reduction in conductance of the material filled in opening 612 may therefore be relatively minimized as the formation of any new intermetallic TiAl$_3$ compounds that would otherwise increase the resistance of the material filled in opening 612 is minimized. Relatively denser and/or smaller-sized semiconductor devices may therefore be fabricated with conductors that benefit from the relatively lower resistance of aluminum (Al) as aluminum (Al) may be used to fill relatively smaller openings with minimized reduction in conductance.

For other embodiments where wetting layer 620 contains TiAl or TiAl$_3$, a first layer containing aluminum (Al) may be sputter deposited at a relatively lower temperature over wetting layer 620 to provide for a relatively thicker layer over which aluminum (Al) is reflowed in filling opening 612. The first aluminum (Al) layer may be deposited over a relatively thinner wetting layer 620, for example. This first aluminum (Al) layer may be deposited to any suitable thickness over wetting layer 620. A second layer containing aluminum (Al) may then be sputter deposited over the first layer and reflowed to form conductive layer 630.

As compared to the conductor fill techniques discussed above with reference to FIGS. 1 through 4, the thickness of wetting layer 620 in conjunction with a first aluminum (Al) layer, if any, may be relatively less as TiAl or TiAl$_3$ remains relatively stable and relatively continuous at reflow and helps to avoid or minimize agglomeration. A conductive layer 630 containing aluminum (Al) may therefore be reflown to fill relatively smaller openings with minimized agglomeration as the thickness for wetting layer 620 in conjunction with any first aluminum (Al) layer may be relatively reduced. Furthermore, any first aluminum (Al) layer may be sputter deposited over wetting layer 620 in openings having relatively smaller widths and/or relatively higher aspect ratios as the thickness for a first aluminum (Al) layer over wetting layer 620 may be relatively reduced. Collimation deposition techniques may therefore be avoided.

For still other embodiments where wetting layer 620 contains TiAl or TiAl$_3$, other suitable materials such as suitable aluminum (Al) alloys may be used to form conductive layer 630 using any suitable technique. Suitable aluminum-copper (Al—Cu) alloys, suitable aluminum-silicon (Al—Si) alloys, or suitable aluminum-silicon-copper (Al—Si—Cu) alloys, for example, may be used to form conductive layer 630 using any suitable technique. A suitable aluminum (Al) alloy may be, for example, sputter deposited and reflowed as discussed above to form conductive layer 630.

For step 530 of FIG. 5, the semiconductor wafer is processed to form a contact, via, interconnect line, or other suitable conductive path for the semiconductor device being fabricated. The semiconductor wafer may be processed using any suitable technique that may depend, for example, on the materials used for layer 610, conductive layer 630, and wetting layer 620 and on the desired conductive path to be formed using conductive layer 630.

Figure 8:
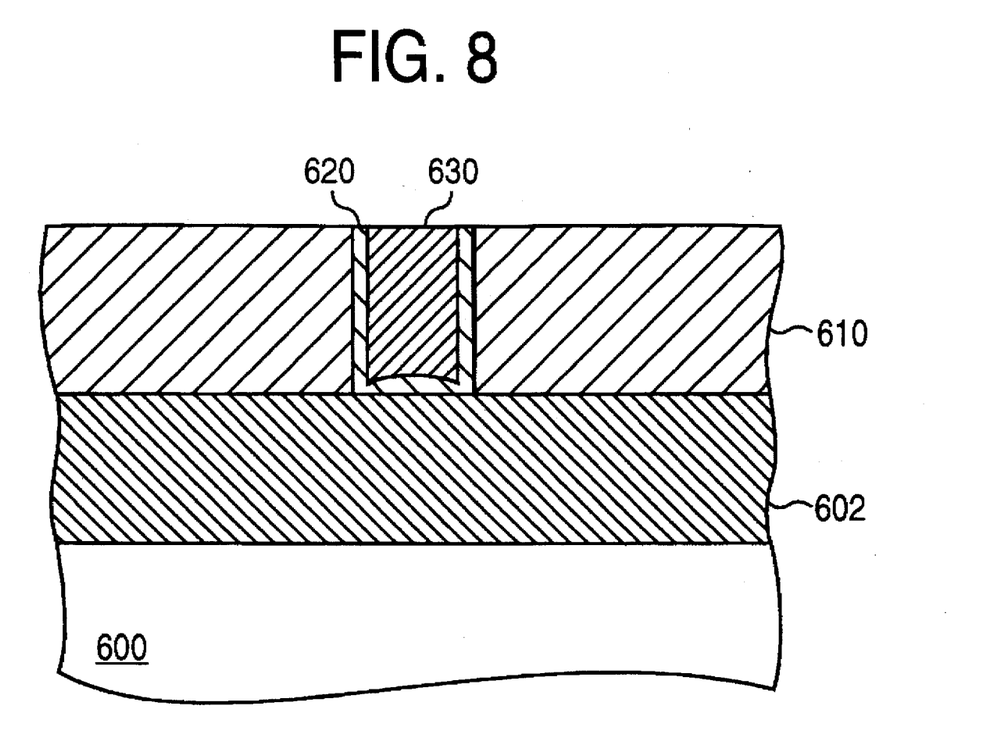
FIG. 8 illustrates a cross-sectional view of the semiconductor wafer of FIG. 7 after the wafer has been planarized in accordance with the method of FIG. 5.

As one example, the semiconductor wafer may be processed, for example by planarization, so as to remove a portion or portions of conductive layer 630 and wetting layer 620 from the top surface of layer 610, as illustrated in FIG. 8. A suitable chemical mechanical polishing (CMP) technique using a suitable slurry may be used, for example, to remove portions of conductive layer 630 and wetting layer 620 from the top surface of layer 610. A suitable etch-back technique using a suitable chemistry may also be used to remove a portion or portions of conductive layer 630 and wetting layer 620 from the top surface of layer 610. As illustrated in FIG. 8, conductive layer 630 and wetting layer 620 may be processed to form a conductive plug in opening 612. In this manner, the conductor fill method of FIG. 5 may be used to form a contact plug, a via plug, or an interconnect, for example, for the semiconductor device being fabricated.

The semiconductor wafer of FIG. 7 may also be processed by patterning conductive layer 630 and wetting layer 620 to form a patterned conductive layer over layer 610. The conductor filled in opening 612 may serve as a contact or via for the patterned conductive layer over layer 610. Conductive layer 630 and wetting layer 620 may be patterned using any suitable technique. As one example, conductive layer 630 and wetting layer 620 may be etched through a suitable mask using any suitable etch technique and chemistry.

Following step 530 of FIG. 5, another suitable layer or layers may be formed over the semiconductor wafer. Other suitable layers include a dielectric layer, a device layer, a via layer, an interconnect layer, and/or a passivation layer, for example.

In the foregoing description, the invention has been described with reference to specific exemplary embodiments thereof. It will, however, be evident that various modifications and changes may be made thereto without departing from the broader spirit or scope of the present invention as defined in the appended claims. The specification and drawings are, accordingly, to be regarded in an illustrative rather than a restrictive sense.

What is claimed is:

1. A method for use in semiconductor device fabrication on a semiconductor wafer, comprising the steps of:
   (a) forming an opening in a layer of the semiconductor wafer;
   (b) forming over the semiconductor wafer and in the opening a wetting layer having an intermetallic compound material; and
   (c) forming over the wetting layer and in the opening a conductive layer.

2. The method of claim 1, wherein the wetting layer comprises aluminum (Al) and titanium (Ti).

3. The method of claim 1, wherein the intermetallic compound material is selected from the group consisting of TiAl and TiAl$_3$.

4. The method of claim 1, wherein the conductive layer comprises aluminum (Al).

5. The method of claim 1, wherein the intermetallic compound material and the conductive layer each include a common element.

6. The method of claim 1, wherein the conductive layer comprises a material selected from the group consisting of aluminum (Al), an aluminum-copper (Al—Cu) alloy, an aluminum-silicon (Al—Si) alloy, or an aluminum-silicon-copper (Al—Si—Cu) alloy.

7. The method of claim 1, wherein the forming step (b) includes the step of depositing the wetting layer over the semiconductor wafer by sputter deposition.

8. The method of claim 1, wherein the forming step (b) includes the steps of:
   (i) depositing a first element of the wetting layer over the semiconductor wafer,
   (ii) depositing a second element of the wetting layer over the semiconductor wafer, and
   (iii) heating the semiconductor wafer to form the intermetallic compound material.

9. The method of claim 1, wherein the forming step (c) includes the step of depositing the conductive layer over the wetting layer by sputter deposition.

10. The method of claim 1, comprising the step of reflowing the conductive layer.

11. A method for use in semiconductor device fabrication on a semiconductor wafer, comprising the steps of:
    (a) forming an opening in a layer of the semiconductor wafer;
    (b) forming over the semiconductor wafer and in the opening a wetting layer having a compound material including at least two elements; and
    (c) forming over the wetting layer and in the opening a conductive layer having one of the at least two elements of the wetting layer.

12. The method of claim 11, wherein the at least two elements include aluminum (Al) and titanium (Ti).

13. The method of claim 11, wherein the compound material is selected from the group consisting of TiAl and TiAl$_3$.

14. The method of claim 11, wherein the one element of the conductive layer is aluminum (Al).

15. The method of claim 11, wherein the one element of the conductive layer is metallic.

16. The method of claim 11, wherein the conductive layer comprises a material selected from the group consisting of aluminum (Al), an aluminum-copper (Al—Cu) alloy, an aluminum-silicon (Al—Si) alloy, or an aluminum-silicon-copper (Al—Si—Cu) alloy.

17. The method of claim 11, wherein the forming step (b) includes the step of depositing the wetting layer over the semiconductor wafer by sputter deposition.

18. The method of claim 11, wherein the forming step (b) includes the steps of:
    (i) depositing each element of the wetting layer over the semiconductor wafer, and
    (ii) heating the semiconductor wafer to form the compound material.

19. The method of claim 11, wherein the forming step (c) includes the step of depositing the conductive layer over the wetting layer by sputter deposition.

20. The method of claim 11, comprising the step of reflowing the conductive layer.

* * * * *